(12) United States Patent
Vaiana et al.

(10) Patent No.: US 11,740,136 B2
(45) Date of Patent: Aug. 29, 2023

(54) SIGNAL PROCESSING CIRCUIT, CORRESPONDING SENSOR DEVICE AND APPARATUS

(71) Applicant: STMicroelectronics S.r.l., Agrate Brianza (IT)

(72) Inventors: Michele Vaiana, San Giovanni la Punta (IT); Paolo Pesenti, Senago (IT); Mario Chiricosta, Trenestieri Etneo (IT); Calogero Marco Ippolito, Aci Castello (IT); Mario Maiore, Aci Sant'Antonio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 348 days.

(21) Appl. No.: 17/011,723

(22) Filed: Sep. 3, 2020

(65) Prior Publication Data

US 2020/0400507 A1 Dec. 24, 2020

Related U.S. Application Data

(63) Continuation of application No. 15/957,999, filed on Apr. 20, 2018, now Pat. No. 10,794,772.

(30) Foreign Application Priority Data

Apr. 27, 2017 (IT) .......................... 102017000045616

(51) Int. Cl.
*G01K 3/14* (2006.01)
*H03H 17/02* (2006.01)
(Continued)

(52) U.S. Cl.
CPC ................. *G01K 3/14* (2013.01); *G01K 7/02* (2013.01); *G01K 7/021* (2013.01); *H03H 17/02* (2013.01);
(Continued)

(58) Field of Classification Search
CPC G01K 3/14; G01K 7/02; G01K 7/021; G01K 2219/00; H03H 17/02;
(Continued)

(56) References Cited

U.S. PATENT DOCUMENTS 5,298,845 A * 3/1994 DeBoer .................... G05B 5/01
318/609
5,459,319 A * 10/1995 Norsworthy .............. G01J 1/44
250/578.1
(Continued)

FOREIGN PATENT DOCUMENTS

CN 101507118 A 8/2009
CN 101662262 A 3/2010
(Continued)

OTHER PUBLICATIONS

First Office Action and Search Report for family-related CN Appl. No 201810386440.3, dated Jun. 2, 2022, 7 pgs.
(Continued)

*Primary Examiner* — Nathaniel T Woodward
*Assistant Examiner* — Philip L Cotey
(74) *Attorney, Agent, or Firm* — Crowe & Dunlevy

(57) ABSTRACT

A circuit includes a first input terminal, a second input terminal, a third input terminal and an output terminal. A first summation node adds signals at the first and third input terminals. A second summation node subtracts signals at the second and third input terminals. A selector selects between the added signals and subtracted signals in response to a selection signal. The output of the selector is integrated to generate an integrated signal. The integrated signal is compared by a comparator to a threshold, the comparator generating an output signal at the output terminal having a first level and a second level. Feedback of the output signal produces the selection signal causing the selector to select (Continued)

the added signals in response to the first level of the output signal and causing the selector to select the subtracted signals in response to the second level of the output signal.

12 Claims, 1 Drawing Sheet

(51) Int. Cl.
*G01K 7/02* (2021.01)
*H03M 3/00* (2006.01)
*H03K 19/003* (2006.01)
*H03K 19/018* (2006.01)

(52) U.S. Cl.
CPC ... *G01K 2219/00* (2013.01); *H03K 19/00307* (2013.01); *H03K 19/01825* (2013.01); *H03M 3/43* (2013.01); *H03M 3/456* (2013.01); *H03M 3/458* (2013.01)

(58) Field of Classification Search
CPC ...... H03K 19/00307; H03K 19/01825; H03M 3/43; H03M 3/456; H03M 3/458
See application file for complete search history.

(56) References Cited

U.S. PATENT DOCUMENTS

| | | | | |
|---|---|---|---|---|
| 5,633,640 | A * | 5/1997 | Barker | H03M 1/089 |
| | | | | 341/163 |
| 10,794,772 | B2 * | 10/2020 | Vaiana | G01K 7/02 |
| 2002/0149508 | A1 * | 10/2002 | Hamashita | H03M 3/496 |
| | | | | 341/172 |
| 2002/0167431 | A1 * | 11/2002 | Poletto | G05B 11/42 |
| | | | | 341/126 |
| 2006/0187099 | A1 * | 8/2006 | Fujimoto | H03M 3/366 |
| | | | | 341/143 |
| 2011/0200070 | A1 * | 8/2011 | Makinwa | H03M 1/14 |
| | | | | 374/170 |
| 2012/0139609 | A1 * | 6/2012 | Putter | G06G 7/18 |
| | | | | 327/337 |
| 2012/0306553 | A1 * | 12/2012 | Kim | G04F 10/005 |
| | | | | 374/170 |
| 2013/0099955 | A1 * | 4/2013 | Shaeffer | H03M 7/3015 |
| | | | | 341/200 |
| 2015/0102951 | A1 * | 4/2015 | Watanabe | H03M 3/464 |
| | | | | 341/143 |
| 2017/0207793 | A1 * | 7/2017 | Englekirk | G01K 7/01 |
| 2017/0227586 | A1 * | 8/2017 | Poletto | G01R 27/14 |
| 2018/0313699 | A1 * | 11/2018 | Vaiana | G01K 3/14 |
| 2019/0068146 | A1 * | 2/2019 | Raman | H03F 3/45753 |

FOREIGN PATENT DOCUMENTS

| | | |
|---|---|---|
| CN | 103957010 A | 7/2014 |
| CN | 208489841 U | 2/2019 |
| EP | 2355358 A1 | 8/2011 |
| EP | 2629430 A2 | 8/2013 |

OTHER PUBLICATIONS

IT Search Report and Written Opinion for IT Appl. No. 102017000045616 dated Jan. 8, 2018 (10 pages).

* cited by examiner

SIGNAL PROCESSING CIRCUIT, CORRESPONDING SENSOR DEVICE AND APPARATUS

CROSS REFERENCE TO RELATED APPLICATIONS

This application is a continuation of U.S. application for patent Ser. No. 15/957,999 filed Apr. 20, 2018, which claims the priority benefit of Italian Application for Patent No. 102017000045616, filed on Apr. 27, 2017, the disclosures of which are hereby incorporated by reference in their entireties to the maximum extent allowable by law.

TECHNICAL FIELD

The description relates to signal processing circuits.

One or more embodiments may be used, for instance, in contactless temperature sensor devices.

BACKGROUND

Objects at a temperature higher than absolute zero emit energy in the form of electromagnetic radiation ("light"). In most instances, that radiation is at a frequency lower than the frequency of visible light and is invisible to the human eye.

Such a radiation may be detected by using electronic devices such as contactless temperature sensors. Contactless temperature sensors can detect, for example, infrared (IR) radiation emitted by an object and, based on that detection, can provide a measure of the temperature of an object without making contact with that object. For instance, infrared energy emitted by an object can be directed (for example, using a lens) onto a certain surface at a receiving interface of a sensor, thereby providing a temperature increase in that surface.

A thermopile is an electronic device that converts thermal energy into electrical energy.

Generation of a voltage in a thermopile may occur as a result of the physical effect known as the Seebeck effect. With heating concentrated on a surface corresponding to a "hot" junction of a thermopile and a "cold" junction designed in order to be insensitive to such a temperature increase, a thermopile will produce, due to the Seebeck effect, a voltage difference which is a function of such heating, namely a voltage difference indicative of (for example, proportional to) the temperature of the object. The voltage difference thus produced may be amplified at a reception interface to provide a measure of the object temperature as an output.

A contactless temperature sensor may permit the detection (measurement) of the temperature of a human body, the temperature of an object, ambient temperature and so on.

A contactless temperature sensor may include an optical filter designed to propagate only a certain wavelength range in the thermal radiation emitted by an object.

Despite the intensive activity in the area just discussed, a demand still exists for improved solutions, especially as regards simplifying the overall structure of the sensor circuit, thus making it less expensive to produce and/or less space consuming, for instance in terms of silicon area occupied in a semiconductor device.

SUMMARY

In an embodiment, a signal processing circuit according to one or more embodiments may be used to produce a binary bit-stream Dout having an average value <Dout> given by a relationship such as:

$$<Dout>=(V1+V3)/(V1+V2)$$

where V1, V2, V3 are three (analog) input signals such as, for example, voltage signals.

The device may comprise a temperature sensor, implemented as a corresponding apparatus such as a contactless (for example, body temperature) thermometer.

One or more embodiments permit to use a compact architecture to read out the temperature of an object with temperature of an object effectively tracked by resorting to a single conversion.

Consequently, while developed in view of the possible use in contactless temperature sensing, the embodiments are not limited to such possible use.

In an embodiment, a circuit comprises:
a first input terminal, a second input terminal, a third input terminal and an output terminal,
a first summation node having the first input terminal and the third input terminal coupled thereto additively,
a second summation node having the third input terminal and the second input terminal coupled thereto subtractively,
a selector having a first input coupled to the first summation node, a second input coupled to the second summation node and an output selectively couplable to the first input or the second input,
an integrator active on the selector output, the integrator having an integrated signal at the integrator output,
a comparator between the integrator and the output terminal, the comparator sensitive to the integrated signal at the integrator output and providing at said output terminal an output signal having a first and a second level, and
a feedback line from the output terminal to the selector wherein the selector output is coupled to the first or second selector input with said output signal at the first or second level, respectively.

In one or more embodiments, the first and second levels of said output signal may include binary levels, "0" and "1".

One or more embodiments a device may include:
a circuit according to one or more embodiments,
a first sensor providing a signal increasing with increasing ambient temperature coupled to said first input terminal,
a second sensor providing a signal decreasing with increasing ambient temperature coupled to said second input terminal,
a thermopile providing a signal indicative of the temperature difference of an object with respect to ambient temperature, the thermopile coupled to said third input terminal, wherein the average value of said output signal is indicative of the temperature of said object.

In one or more embodiments, the first sensor may include a pair of bipolar transistors differing from each other for at least one of the transistor area and transistor bias current, wherein the signal increasing with increasing ambient temperature includes the difference of the base-to-emitter voltages of the bipolar transistors in said pair of bipolar transistors.

In one or more embodiments, the second sensor may include a single bipolar transistor, wherein the signal decreasing with increasing ambient temperature includes the base-to-emitter voltage of said single bipolar transistor.

One or more embodiments may include an averaging circuit block to produce an average value of said output signal.

In one or more embodiments, the averaging circuit block may include a decimation filter active on said output signal.

A method of operating a circuit or a device according to one or more embodiments may include maintaining said third input terminal at a (voltage) level lower than the (voltage) signal at said second input terminal, wherein the average value of said output signal lies between 0 and 1.

In an embodiment, an apparatus (for example, a contactless thermometer) may include:
  a device according to one or more embodiments,
  a temperature display unit coupled to said device, the temperature display unit configured to display the average value of said output signal.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
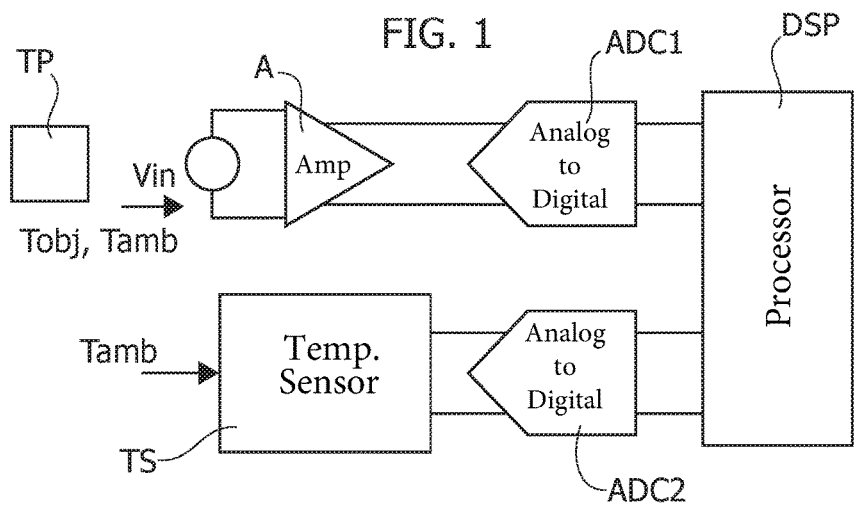
FIG. 1 is a block diagram of a contactless temperature sensor.

FIG. 1 is a block diagram of a contactless temperature sensor.

As discussed previously, a thermopile TP may be used for generating a (voltage) signal proportional to the temperature Tobj of an object.

More specifically:
  if the "hot" joint of the thermopile receives radiated (electromagnetic) energy from an object at ambient temperature and the temperature of the "cold" joint of the thermopile is also at the ambient temperature the thermopile TP will produce differential output voltage equal to zero, the cold joint of a thermopile may be designed (in a manner known per se) in order not to be exposed to radiation from the object: the cold joint may thus be assumed to be at a temperature Tcold equal to ambient temperature Tamb, with radiation from the object reaching (only) the hot joint of the thermopile, when the hot joint of the thermopile receives radiated energy from an object at a temperature Tobj higher/lower than ambient temperature, then the hot joint will be at a temperature Thot correspondingly higher/lower (with a difference $\Delta T$) with respect to ambient temperature.

The voltage Vin from the thermopile will thus be indicative of (proportional to) to difference between the temperature of the hot joint and the temperature of the cold joint, namely to the difference between the object temperature and ambient temperature:

$$Vin = \Delta T * S = (Thot - Tcold) * S = (\alpha * Tobj - Tamb)$$

where:
S is the Seebeck coefficient of the thermopile and
$\alpha$ a is a proportionality factor of the temperature between the object temperature and the temperature of the hot joint of the thermopile.

In a circuit arrangement as exemplified in FIG. 1, the signal Vin from the thermopile TP is amplified in an amplifier (Amp) A and converted into a digital signal in a (first) analog-to-digital converter ADC1.

As discussed previously, the signal Vin is indicative of the amount the temperature of an object is higher/lower than ambient temperature. Consequently, in an arrangement as exemplified in FIG. 1, the ambient temperature Tamb is sensed (by a temperature sensor TS—of any known type) and then converted into a digital signal via a (second) analog-to-digital converter ADC2.

Based on the relationship reported above, a processor DSP (for instance a digital signal processor) configured to receive the signals from the two converters ADC1, ADC2 can calculate the value of the object temperature Tobj starting from the ambient temperature Tamb and the signal Vin from the thermopile TP.

An arrangement as exemplified in FIG. 1 senses (simultaneously) the signal from the thermopile TP and the signal from the sensor TS of the ambient temperature by using a reception chain including two converters ADC1, ADC2. Using two converters involves a certain current consumption; also, the two converters take a corresponding area, for example, in a semiconductor device such as an integrated circuit.

The possibility can be considered of using a single converter operating according to a time-division multiplex scheme, namely by reading, alternatively, the signal from the thermopile TP and the signal from the sensor TS. While such an approach may involve reduction in terms of area, the advantages in terms of current consumption may be hardly appreciable insofar as a single converter may require to be turned on for a time that is twice the activation times of the individual converters in an arrangement including two converters.

An additional disadvantage of a multiplexing scheme my lie in that, in comparison with a two-converter arrangement as exemplified in FIG. 1, detecting the signals from the thermopile TP and the temperature sensor TS at different times may lead to errors insofar as a change in the ambient temperature between two subsequent measurements may lead to a corresponding error in evaluating the object temperature.

Figure 2:
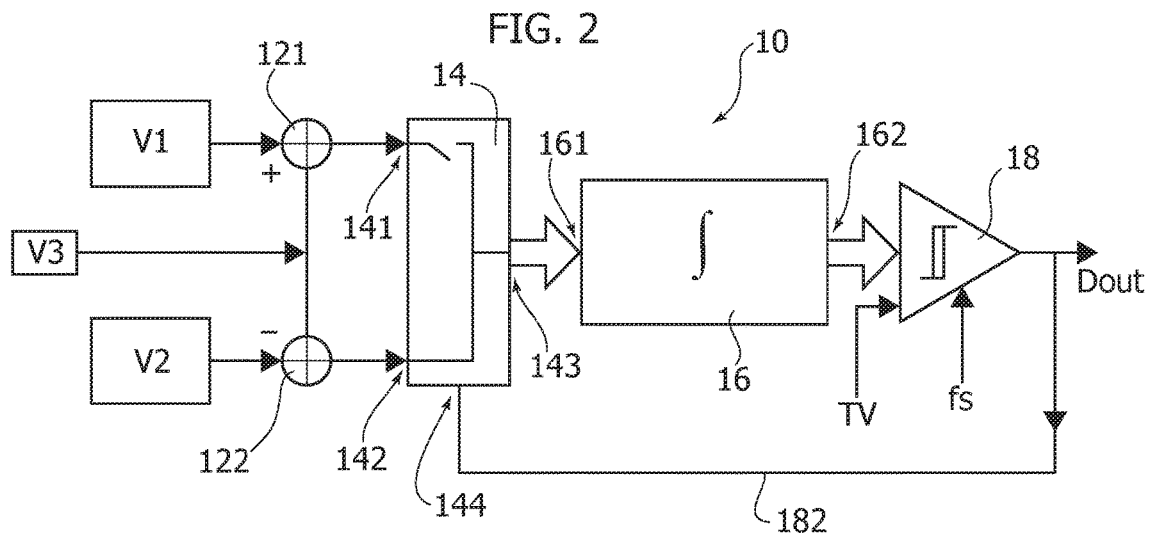
FIG. 2 is a block diagram of a circuit according to one or more embodiments.

FIG. 2 is an exemplary diagram of a circuit according to one or more embodiments.

As noted previously, while developed with a view to the possible use in a temperature sensor (including, for example, a thermopile) a circuit 10 as exemplified in FIG. 2 may be applied in a variety of different contexts insofar as such a circuit may provide an analog-to-digital (ADC) conversion of three (analog) input signals generally designated V1, V2 and V3 into an output digital signal Dout: reference herein to possible use in temperature sensors is thus exemplary and not limitative of the embodiments.

In one or more embodiments the output signal Dout may be a binary bitstream at a frequency fs, that is a signal which takes a first value (e.g. "0") and a second value (e.g. "1") and generated at a (sampling) frequency fs.

In one or more embodiments as exemplified in FIG. 2, a circuit 10 may thus include a first input terminal V1, a second input terminal V2 and a third input terminal V3 as well as an output terminal at which the output signal Dout is present.

In one or more embodiments as exemplified in FIG. 2, the circuit 10 includes a first summation node 121 and a second summation node 122.

The third input terminal V3 is coupled to the first summation node 121 together with the first input terminal V1. The first and the third input terminals V1, V3 are coupled "additively" (that is both with a same, for example, positive sign, mathematically +V1+V3) at the first summation node 121, which in fact acts as an addition node.

The third input terminal V3 is also coupled to the second summation node 122 together with the second input terminal V2. The second and third terminals V2, V3 are coupled "subtractively" (that is with opposed signs, for example negative and positive signs, mathematically −V2+V3) at the second summation node 122, which in fact acts as a subtraction node.

In the diagram of FIG. 2 reference 14 denotes a selector (for example, a multiplexer circuit) having a first input 141 coupled to the first summation node 121 and a second input 142 coupled to the second summation node 122.

The selector 14 also includes an output terminal 143 which may be coupled (alternatively) to the first input 141 or the second input 142 as a function of a control signal provided at a control input 144 of the selector 14 as discussed in the following.

Cascaded (downstream) to the selector 14 an integrator 16 is provided, the integrator 16 receiving on an input 161 the output 143 from the selector 14.

As a function of the signal output from the selector 14 at output 143, the integrator 16 provides at an output 162 an integrated signal which is fed to a comparator 18 arranged between the integrator 16 and the output terminal at which the signal Dout is provided. The comparator 18 thus provides at the output terminal of the circuit 10 an output signal Dout having a first and a second level (e.g. "0" and "1").

The comparator 18 operates with a threshold value TV at a (sample) frequency fs.

The (binary) output signal Dout is coupled via a feedback line 182 to the control input 144 of the selector.

Operation of the circuit 10 as exemplified in FIG. 2 can be arranged in such a way that the output signal from the integrator 16 (at output 162) has an average value which is essentially equal to zero.

For instance, operation of the circuit 10 as exemplified in FIG. 2 can be adjusted in such a way that when the output signal of the integrator 16 is higher than the threshold value TV, the input selector 144 will select a certain input signal (for example, input 141 or input 142) in order to change the slope of the output signal of the integrator. Similarly, when the output signal is below the threshold value TV the input selector will change the input signal (for example, input 142 or input 141) and output signal slope in order to have an average value of the output signal equal to zero.

For the purposes of such operation the input signals V1, V2 and V3 can be reasonably assumed to be constant or to have a bandwidth relatively lower than the frequency clock fs of the overall system.

In one or more embodiments, the signals applied to the terminals V1, V2, V3 can be voltage signals (for simplicity the same designation is used herein for the terminals and the respective signals at those terminals).

In one or more embodiments, the selector 14 can be controlled via the feedback line 182 such that, with Dout=0 (first level), the selector 14 is set in a condition where the output signal at output 143 corresponds to the input signal at input 141 (namely V1+V3) while for Dout=1 (second level) the selector output 143 is coupled to the selector input 142 (−V2+V3).

With such a control logic, the average value of the integrated signal from the integrator 16 (output 162) may be substantially zero and in that case the following relationship applies:

$$(1-Dout)*(V1+V3)+Dout*(-V2+V3)=0.$$

Consequently, the average value of the output signal Dout, namely <Dout> may be expressed as:

$$<Dout>=(V1+V3)/(V1+V2)$$

The signal Dout is a binary bitstream at the sampling frequency fs, whose average value is given by the relationship above. The average value of the binary signal Dout may be obtained from that bitstream, in a manner known per se, for example, via digital decimation filters and presented on a display screen included in a unit D.

In one or more embodiments the range of variation of the signals at the terminals V1, V2 and V3 can be selected in such a way the average value of Dout lies between 0 and 1, which may correspond to the signal at the terminal V3 being (always) lower than the signal of the terminal V2.

As noted, the signal processing circuit 10 of FIG. 2 can be applied—in general—in various contexts where starting from three input signals applied at terminals V1, V2 and V3 a signal Dout having an average value given by the last cited relationship is desired. Again, it is stressed that one or more embodiments are not limited to the possible use in contactless temperature sensors.

Figure 3:
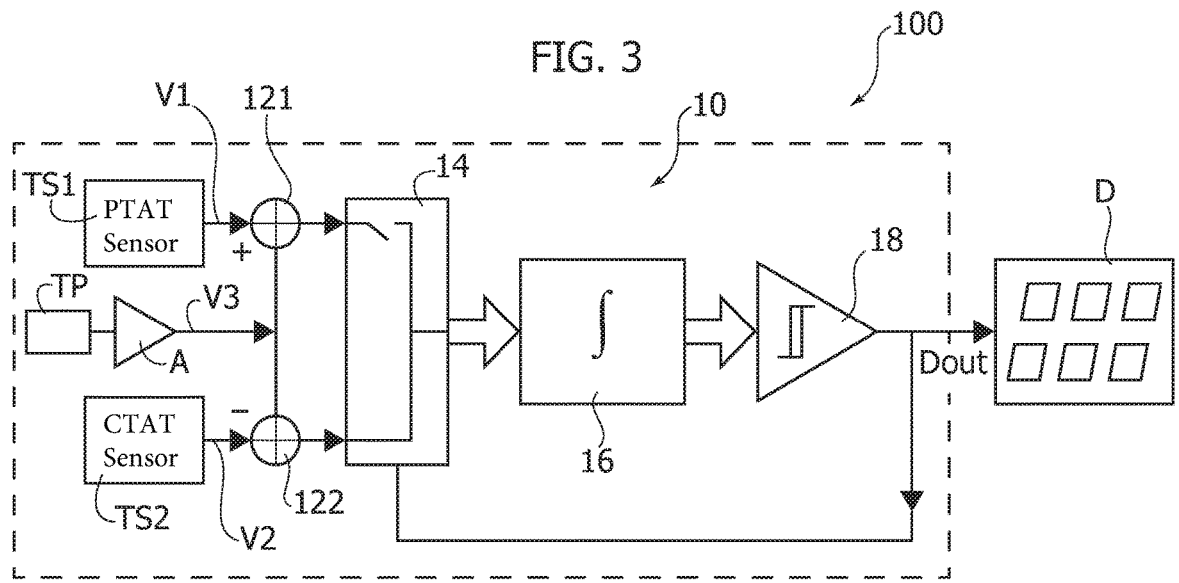
FIG. 3 is exemplary of the possible use of a circuit according to one or more embodiments in a contactless temperature sensor.

With that proviso, FIG. 3 is exemplary of a possible application of the circuit 10 of FIG. 2 in a temperature sensor 100 wherein the signal Vin from a thermopile TP is applied to the input terminal V3 with a gain G applied thereto in an (amplifier) stage A.

In an arrangement as exemplified in FIG. 3, the input terminal V1 may receive a signal Vptat which may be a so-called PTAT (Proportional To Absolute Temperature) signal, namely a signal, for example, a voltage, which increases with an increase in temperature as obtained in a sensor TS1.

In one or more embodiments, such a sensor may include two bipolar transistors (BJTs) having different areas and/or biased with a different current so that the difference between the respective base-to-emitter voltages Vbe of the two transistors may be exemplary as of a signal Vptat having the characteristics discussed previously.

Also, the signal applied to the terminal V2 may be a signal Vbe in the form of a CTAT (Complementary To Absolute Temperature), namely a signal, for example, a voltage, which decreases with an increase in temperature as obtained in a sensor TS2. Such a sensor may include again a bipolar transistor (BGT), the base-to-emitter voltage Vbe of such transistor being exemplary of such a signal.

In one or more embodiments sensors such as TS1 and TS2 may rely on the fact that the base-to-emitter voltage of a bipolar transistor decreases with an increase in temperature while the differences between the base-to-emitter voltages of two bipolar transistors having different areas and/or polarized with different bias currents may in fact increase with increasing temperature.

By substituting for the voltages applied to the input terminals V1, V2 and V3 corresponding values as defined previously:

V1=M*Vptat (where M is a constant selected in such a way that a voltage Vref may be produced corresponding to the sum of Vbe+M*Vptat with Vref having a first order temperature variation coefficient equal to zero), $$V2=Vbe,$$

$$V3=G*Vin$$

the previous expression for the average value of the output signal Dout may be expressed as $$<Dout>=(G*Vin+M*Vptat)/Vref$$

As noted, the signal Vref may be reasonably considered to be constant with temperature and thus regarded as a simple constant.

The relationship mentioned above indicates that an arrangement as exemplified in FIG. 3 will produce an output signal including a bitstream having an average value which is the sum of a signal Vin (which may be produced via a thermopile and thus be indicative of the difference of the temperature of an object to ambient temperature) multiplied by gain factor G plus a signal Vptat indicative of the ambient temperature which may be expressed as Sptat*Tamb, where Tamb is the ambient temperature and Sptat is a constant proportionality factor.

The previous relationships may thus lead to an average value for Dout which may be expressed as $$<Dout>=(G*(\alpha*Tobj-Tamb)*S+M*Sptat*Tamb)/Vref$$

Consequently, by selecting G=(M*Sptat)/S the previous relationship translates into $$<Dout>=Tobj*(G*\alpha*S/Vref).$$

Consequently the average value of the signal Dout is indicative of (directly proportional to) the temperature of the object, which may be calculated, for example via decimation filtering, and displayed on a display unit D.

One or more embodiments may be advantageous over arrangements as exemplified in FIG. 1 insofar as they de facto rely on a single analog-to-digital conversion circuit providing an object temperature.

This compares over an arrangement as exemplified in FIG. 1, which—when wishing to sense at the same time the signals form the thermopile and the temperature sensor TS—includes two converters ADC1 and ADC2.

An arrangement as exemplified in FIGS. 2 and 3 is also advantageous over a single time-multiplex converter insofar as—in an arrangement as exemplified in FIGS. 2 and 3—the signal from the thermopile and the signals from the temperature sensors are captured at the same time (and not at two different times) thus avoiding the risk of errors in case ambient temperature varies between two subsequent detection (sensing) times.

One or more embodiments as exemplified in FIGS. 2 and 3 may also provide advantages in terms of area and current consumption insofar as the signals from the thermopile and the temperature sensor(s) may be combined directly in providing the object temperature thus avoiding drawbacks as related to time division multiplex as discussed previously.

One or more embodiments may thus concern a circuit (for example, 10) including:
  a first input terminal (for example, V1), a second input terminal (for example, V2), a third input terminal (for example, V3) and an output terminal (for example, Dout),
  a first summation node (for example, 121) having the first input terminal and the third input terminal coupled thereto additively (with the same sign, for example plus),
  a second summation node (for example, 122) having the third input terminal and the second input terminal coupled thereto subtractively (with opposes signs, for example plus and minus),
  a selector (for example, 14) having a first input (for example, 141) coupled to the first summation node, a second input (for example, 142) coupled to the second summation node and an output (for example, 143) selectively (for example, 144) couplable to the first input or the second input,
  an integrator (for example, 16) active on the selector output, the integrator having an integrated signal at the integrator output (for example, 162),
  a comparator (for example, 18) between the integrator and the output terminal, the comparator sensitive to the integrated signal at the integrator output and providing at said output terminal an output signal having a first and a second level, and
  a feedback line (for example, 182) from the output terminal to the selector wherein the selector output is coupled to the first resp. second selector input with said output signal at the first resp. second level.

In one or more embodiments, the first and second levels of said output signal may include binary levels, "0" and "1".

One or more embodiments a device may include:
  a circuit according to one or more embodiments,
  a first sensor (for example, TS1) providing a signal increasing with increasing ambient temperature coupled to said first input terminal,
  a second sensor (for example, TS2) providing a signal decreasing with increasing ambient temperature coupled to said second input terminal,
  a thermopile (for example, TP) providing a signal indicative of the temperature difference of an object with respect to ambient temperature, the thermopile coupled to said third input terminal, wherein the average value of said output signal is indicative of the temperature of said object.

In one or more embodiments, the first sensor may include a pair of bipolar transistors differing from each other for at least one of the transistor area and transistor bias current, wherein the signal increasing with increasing ambient temperature includes the difference of the base-to-emitter voltages of the bipolar transistors in said pair of bipolar transistors.

In one or more embodiments, the second sensor may include a single bipolar transistor, wherein the signal decreasing with increasing ambient temperature includes the base-to-emitter voltage of said single bipolar transistor.

One or more embodiments may include an averaging circuit block (for example, included in the display unit D of FIG. 3) to produce an average value of said output signal.

In one or more embodiments, the averaging circuit block may include a decimation filter active on said output signal.

A method of operating a circuit or a device according to one or more embodiments may include maintaining said third input terminal at a (voltage) level lower than the (voltage) signal at said second input terminal, wherein the average value of said output signal lies between 0 and 1.

Apparatus (for example, a contactless thermometer) according to one or more embodiments may include:
- a device according to one or more embodiments,
- a temperature display unit (for example, D) coupled to said device, the temperature display unit configured to display the average value of said output signal.

Without prejudice to the underlying principles, the details and the embodiments may vary, even significantly, with respect to what has been described by way of example only, without departing from the extent of protection. The extent of protection is defined by the annexed claims.

The invention claimed is:

1. A method, comprising:
   additively combining a first signal and a third signal to generate an addition signal;
   subtractively combining a second signal and the third signal to generate a subtraction signal;
   selecting the addition signal for output as a selection signal in response to a first logic state of a bit in a selection bitstream;
   selecting the subtraction signal for output as said selection signal in response to a second logic state of the bit in the selection bitstream;
   integrating the selection signal to generate an integration signal; and
   comparing the integration signal to a threshold to generate each bit of the selection bitstream.

2. The method of claim 1, further comprising maintaining the third signal at a level lower than a level of said second signal.

3. The method of claim 1, wherein an average value of said selection bitstream lies between 0 and 1.

4. The method of claim 3, further comprising displaying an average value generated by digitally decimating the selection bitstream.

5. The method of claim 4, wherein said third signal is generated by a temperature sensor, and wherein said displaying comprises displaying a temperature value.

6. The method of claim 1, further comprising digitally decimating the selection bitstream.

7. The method of claim 1, wherein said first signal is a proportional to absolute temperature signal and said second signal is a complementary to absolute temperature signal and said third signal is generated by a temperature sensor.

8. The method of claim 7, wherein said temperature sensor is a thermopile.

9. The method of claim 7, further comprising:
   generating said proportional to absolute temperature signal by determining a difference in base-to-emitter voltages of two bipolar transistors; and
   generating said complementary to absolute temperature signal by determining a base-to-emitter voltage of a further bipolar transistor.

10. The method of claim 1, further comprising generating bits of the selection bitstream at a rate corresponding to a sampling rate for comparing the integration signal to the threshold.

11. The method of claim 1, wherein each of the first signal, second signal, third signal, addition signal, subtraction signal, selection signal, and integration signal is an analog signal.

12. The method of claim 1, wherein:
   selecting the addition signal for output as the selection signal comprises controlling a multiplexer circuit having the addition signal as an input to pass the addition signal in response to the first logic state of the bit in the selection bitstream; and
   selecting the subtraction signal for output as the selection signal comprises controlling the multiplexer circuit having the subtraction signal as an input to pass the subtraction signal in response to the second logic state of the bit in the selection bitstream.

* * * * *